METHOD OF MAKING A MULTILAYERED LAMINATED CIRCUIT BOARD

Filed Dec. 23, 1963

INVENTORS
KEVIN J. ROCHE
PAUL H. PALMATEER

BY David N Koffsky
ATTORNEY

United States Patent Office 3,319,317
Patented May 16, 1967

3,319,317
METHOD OF MAKING A MULTILAYERED LAMINATED CIRCUIT BOARD

Kevin J. Roche, Poughkeepsie, and Paul H. Palmateer, Wappingers Falls, N.Y., assignors to International Business Machines Corporation, New York, N.Y., a corporation of New York Filed Dec. 23, 1963, Ser. No. 332,709
1 Claim. (Cl. 29—155.5)

Figure 1:
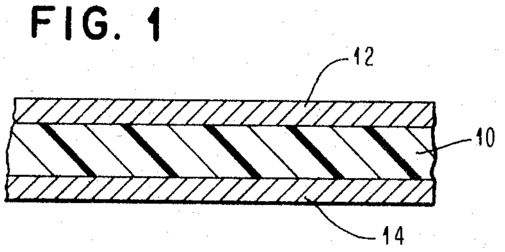

This invention relates to printed circuits and more particularly to a method for providing electrical connections between opposing sides of a printed circuit board.

In the production of printed circuits, many methods have been used to provide electrical connections through circuit boards. The actual connectors have run the gamut from conductive inserts such as rivets to plated-through holes. Since the plated-through hole lends itself to mass production processes it is today one of the most widely used techniques.

The production of plated-through holes first requires that the circuit board be selectively drilled or perforated to provide holes at the points where connections are eventually desired. If the circuit board is already provided with conductive surfaces, it is then only necessary to coat the interior walls of the holes with copper or another conductive metal so as to provide the necessary through electrical connection. The aforementioned coating of the interior walls of the through-hole can be accomplished by a number of known processes, a preferred one being disclosed in U.S. Patent 3,099,608 to Radovsky et al., assigned to the same assignee as is this application.

In certain applications, the plated-through hole is somewhat unsatisfactory. For instance, in the production of thin film memories, conductive winding arrays are manufactured on ⅛th to 1 mil thickness dielectrics with .7 mil layers of copper clad thereon. To only connect to the edge of a .7 mil thick copper (as does the conventional plated-through hole), does not result in reliable electrical contact. Additionally, today's high speed logic circuits require laminated printed circuits which utilize extremely thin dielectrics. In such laminated circuits, it is not unusual to find 1–2 mil thick dielectrics coated with .7–1.5 mil layers of copper. To make connections to internal circuit layers of such multilayer boards is extremely difficult, since only a thin edge of the conductor is exposed within the hole. Such small cross section areas are insufficient to assure a reliable finished connection. Moreover, when through-holes are drilled, the dielectric material is often caused to "flow" or smear over portions of the exposed conductor edge thereby further reducing the available contact area.

Accordingly, it is an object of this invention to provide an improved process for the production of conductive printed circuit connections.

It is a further object of this invention to provide an improved through-hole connective scheme whereby increased connective areas are provided.

A still further object of this invention is to provide an inexpensive method for the production of conductive through-hole connections.

Still another object of this invention is to provide a method for producing through-hole connections to interior circuit layers of a laminated circuit board.

In accordance with the above stated objects, a sheet of dielectric having at least one side clad with a conductive material is subjected to an etchant in discrete areas where through connections are desired. The etchant removes the dielectric thus creating holes which expose the conductive coating on the other side. The etchant is chosen so that it has little or no effect upon the conductive cladding. The holes thus etched are then coated with a conductive material which connects the exposed conductive coating with the opposite side of the dielectric sheet.

The foregoing and other objects, features and advantages of the invention will be apparent from the following more particular description of a preferred embodiment of the invention, as illustrated in the accompanying drawings.

In the drawings:

FIGS. 1–5*a* are fragmentary sectional views illustrating certain steps of the inventive method which are successively performed on a circuit board.

Figure 4:
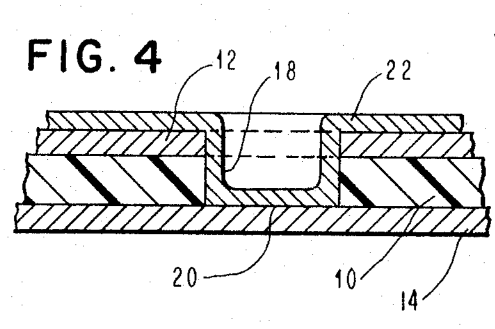
Figure 5A:
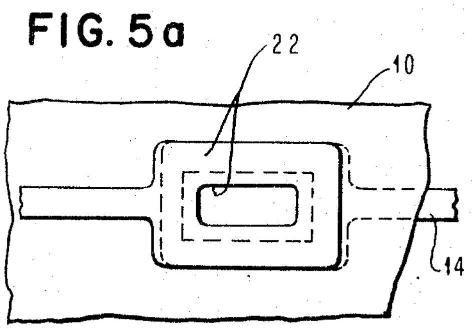
Figure 5:
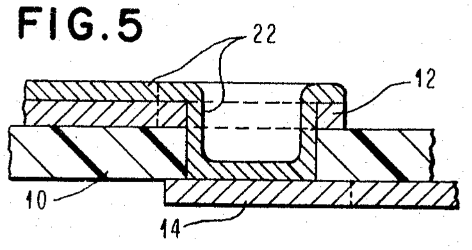
Figure 6A:
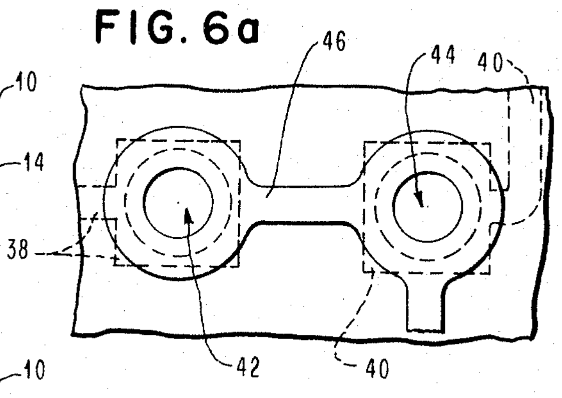
Figure 6:
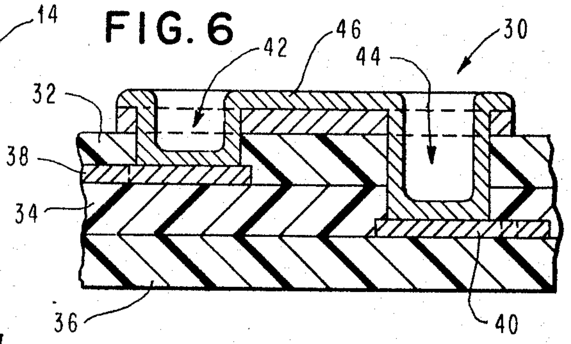

FIGS. 6 and 6*a* are sectional views showing the application of the process of FIGS. 1–5*a* to a laminated circuit board.

Referring now to FIG. 1, dielectric sheet 10 has conductive sheets 12 and 14 clad on either side thereof. The thickness of conductive sheets 12 and 14 may, for example, approximate .7 mil and the thickness of insulating sheet 10 may approximate 1 mil. The desired end objective is to provide a reliable electric connection between conductive sheets 12 and 14 through dielectric sheet 10.

Figure 2A:
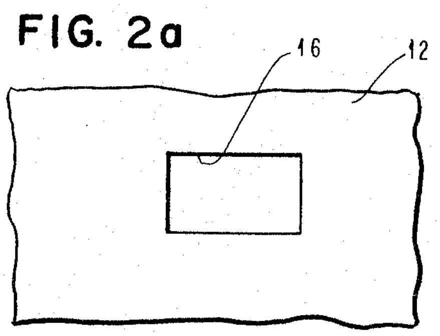
Figure 2:
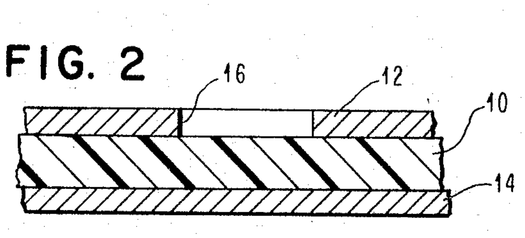

As shown in FIG. 2, an opening 16 is etched in copper sheet 12 so as to expose an area of dielectric sheet 10. The etching process may be carried out by any of a number of well known commercial processes. For instance, in one exemplary process, conductive sheet 12 is coated with a photoresist and then exposed through a piece of transparent artwork having the desired hole configurations drawn thereon. The unexposed areas of the photoresist (to be etched) are then removed and an etchant applied to the underlying exposed conductive material. If material 12 is copper, a suitable etchant is ferric chloride. When the etchant has etched completely through conductive sheet 12, the circuit board is washed to terminate its action. FIG. 2*a* is a plan view of the etched circuit board of FIG. 2 showing that hole area 16 may be made any shape, e.g., rectangular, round, etc.

Figure 3:
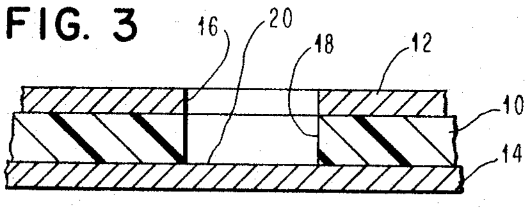

Next, as shown in FIG. 3, the exposed portion of dielectric sheet 10 is subjected to a dielectric etchant to cause the removal of the area below opening 16 and the generation of hole 18. The choice of the etchant is dependent upon the dielectric material used. If, for instance, dielectric 10 is polyethylene-terephthalate (better known as "Mylar" a trademark of the Du Pont Corp., Wilmington, Del.) an etchant of hot concentrated sulphuric acid is effective. Such acid may be heated from 140–160° F. and have a concentration of 80–98%. This same etchant is effective to etch phenolics, epoxy papers, and other epoxy materials utilized as printed circuit carriers. If insulating sheet 10 is epoxy glass, the concentrated sulphuric acid is effective in etching the epoxy encapsulant, but it has no effect upon the glass fibers themselves. To etch the glass fibers, a solution of hot concentrated sodium hydroxide must be subsequently applied. Hydrofluoric acid may also be used.

The above mentioned etchants must be chosen so that they have little or no effect upon conductive sheets 12 and 14 respectively. In this manner, while the etchant removes the dielectric material and generates hole 18, it leaves conductors 12 and 14 unaffected. The result is that previously hidden portion 20 of conductive sheet 14 is now exposed to the upper surface of the circuit board through etched-out area 18.

To terminate the dielectric etching process, the board is subjected to a water rinse and a subsequent neutralizing alkaline dip. If a sufficiently high velocity water rinse is used, the alkaline dip is unnecessary.

Referring now to FIG. 4, the etched board of FIG. 3 is subjected to a plating process whereby a layer of conductive metal 22 is caused to be overlaid over the entire surface of the circuit board (including etched hole 18). This can be accomplished by any of several techniques, and is preferably the technique described in the aforementioned Patent 3,099,608 to Radovsky et al. As described in that patent, to provide the necessary surface preparation for a subsequent electroplating step, a layer of palladium chloride is first electrolessly deposited over the entire upper surface of the circuit board. This layer essentially "seeds" the surface and enables it to be electroplated. A thicker layer of copper is then electroplated over the palladium chloride. If desired, protective layers of silver or nickel may be electroplated over the copper.

At this point in the process, the through connective holes are fully fabricated and the remaining circuitry may then be produced.

In FIGS. 5 and 5*a*, the completed feed-through circuit connection is shown. In FIG. 5 conductor 14 has been etched so as to leave a rectangular conductive area connecting it to conductive layer 22. Conductive layer 22 forms the conductive bridge between conductor 14 and conductor 12 which has also been etched to provide a land area around the feed-through connection. FIG. 5*a* is a plan view of the connective scheme showing the relative locations of the land areas. As can be seen from FIG. 5, the major advantage of this connective method is the relatively large area of contact between conductor 22 and conductor 14 which provides a permanent and reliable connection. If the standard through-hole plated process were used, conductor 22 would only connect to the edges of conductor 14 with the result that the area of contact would be much smaller with a higher probability of failure.

Referring now to FIGS. 6 and 6*a*, the aforementioned connective process to multilayer laminated circuits will be described. In FIG. 6, circuit board 30 comprises a lamination of dielectric sheets 32, 34 and 36. Embedded between dielectric sheets 32 and 34 is conductor 38 and likewise embedded between insulating sheets 34 and 36 is conductor 40. To make conductors 38 and 40 respectively available so that they may be connected either to one another, to an external circuit, or to another layer of the circuit board 30, areas 42 and 44 are etched to expose the aforementioned conductors. If it is desired to interconnect conductors 38 and 40, the electroless deposition and electroplating process described in reference to FIG. 4 would be utilized.

The only difference between the process as described for FIGS. 1–5*a* and the process at it applies to FIG. 6, is that the etching of the dielectric circuit sheets must be somewhat modified to prevent undercutting. Undercutting occurs when the circuit board etchant begins attacking the dielectric not only downwardly but also laterally to cause undesired removal of the circuit board beneath the areas which are masked. To prevent this from occurring, the etching of the dielectric circuit sheets can be done in steps with the deepest hole to be etched being the first started (e.g., 44). Once the hole which is to be the deepest has been etched through a single lamination, the board is rinsed to neutralize the etchant.

Then, a second application of etchant is applied both to the area wherein one lamination has already been etched and also to the next shallower hole, e.g., 42 (area 42 being masked during the initial etching step). The etchant then removes another layer of circuit board and the process is again halted. This procedure may be continued until all holes are etched to the desired depth. By this technique, undercutting is kept to a minimum due to each layer being etched independently of the etching of the other layers. Of course, if each lamination of the circuit board is thin, then two or three or more laminations can be etched in one step with no fear of undercutting.

Once the required holes have been fully etched, conductive layer 46 is applied to provide the desired interlayer interconnections (as above described) and the exposed portion of the circuit board etched to provide the top layer interconnecting circuitry (FIG. 6*a*). Obviously all interior circuit lands must be pre-etched before lamination, so that the required lands are aligned with the areas where conductive connections are subsequently to be made.

While the invention has been particularly shown and described with reference to a preferred embodiment thereof, it will be understood by those skilled in the art that various changes in form and details may be made therein without departing from the spirit and scope of the invention. For instance, if it is desired to etch a circuit board havnig only a single laminate of conductor clad thereto, the opposite unclad side of the circuit board can be masked with a metal etch resist which will perform the same function as the etched conductor described in relation to FIGS. 2 and 3. Additionally, while electroless and electroplating deposition processes have been described to provide the desired electrical interconnections, solder balls may also be inserted into the etched holes and caused to flow and bond by the subsequent application of heat. Alternatively, the internal and external circuit lands may be lead-tin plated as the board is being manufactured. Once the etching process had been completed, the entire circuit board can then be heated to cause a reflowing of the lead-tin plating to make the desired interconnections.

We claim:

A method for providing selective electrical connections between a plurality of layers of a multilayer laminated circuit board, said circuit board including a plurality of insulating sheets with conductive lands laminated therebetween, at least one surface of said circuit board having a mask applied thereon, the method comprising the steps of:

removing portions of said mask over the most deeply laminated conductive lands within said circuit board to which connections are to be made;

applying an insulating sheet etchant through said removed portions of said mask to the exposed board areas to produce etched holes in said sheets, said etchant being chosen to have little or no effect on said conductive lands;

terminating the action of said etchant before it begins to undercut the sides of said etched holes;

removing additional portions of said conductive mask which are positioned over board areas wherein connections are to be made to conductors less deeply laminated within the circuit board;

reapplying said insulating sheet etchant through said conductive mask to all exposed board areas to both continue the etching action in holes already started and to commence the etching action into the newly exposed areas;

terminating the action of said etchant before undercutting commences;

repeating said mask removal, etchant application and etchant action terminating steps until all interior conductive lands to which connections are desired are exposed each conductive land which is exposed, acting to inhibit the further penetration of said insulating sheet etchant into said circuit board; and coating the thereby produced holes and exposed conductive lands with another conductor.

References Cited by the Examiner

UNITED STATES PATENTS

| | | | |
|---|---|---|---|
| 378,423 | 2/1888 | Baynes | 156—11 |
| 2,421,607 | 6/1947 | Fowler | 156—3 X |
| 2,965,952 | 12/1960 | Gillett et al. | 156—3 |
| 3,042,591 | 7/1962 | Cado | 41 |
| 3,042,740 | 7/1962 | Bosworth | 174—68.5 |
| 3,046,176 | 7/1962 | Bosenberg | 156—11 |
| 3,053,929 | 9/1962 | Friedman | 174—68.5 |
| 3,099,608 | 7/1963 | Radovsky et al. | 41 |
| 3,116,191 | 12/1963 | Day | 156—3 |

OTHER REFERENCES

IBM Tech. Discl. Bul., vol. 6, No. 8, Jan. 8, 1964, pp. 82 and 87.

ALEXANDER WYMAN, *Primary Examiner.*

JOHN P. WILDMAN, JACOB H. STEINBERG, *Examiners.*

D. L. CLAY, *Assistant Examiner.*